(12) United States Patent
Liu

(10) Patent No.: US 6,885,245 B2
(45) Date of Patent: Apr. 26, 2005

(54) DIFFERENTIAL AMPLIFIER AND COMPARATOR USING THE SAME

(75) Inventor: Zhong-Ding Liu, Beijing (CN)

(73) Assignee: VIA Technologies, Inc., Taipei (TW)

(*) Notice: Subject to any disclaimer, the term of this patent is extended or adjusted under 35 U.S.C. 154(b) by 0 days.

(21) Appl. No.: 10/408,253

(22) Filed: Apr. 8, 2003

(65) Prior Publication Data
US 2004/0201420 A1 Oct. 14, 2004

(51) Int. Cl.[7] ............................................. H03F 3/45
(52) U.S. Cl. ..................................... 330/253; 330/260
(58) Field of Search ............................. 330/252, 253, 330/260, 277; 327/359

(56) References Cited

U.S. PATENT DOCUMENTS 5,532,644 A * 7/1996 Nakagawara ............... 330/254
5,912,587 A * 6/1999 Mihailovits et al. ........ 330/252
6,084,470 A * 7/2000 Shiramatsu et al. ........ 330/252

* cited by examiner

Primary Examiner—Khanh V. Nguyen
(74) Attorney, Agent, or Firm—Rabin & Berdo, P.C.

(57) ABSTRACT

A differential amplifier. A differential pair constructed by a first transistor and the second transistor receives differential input signals. The gate terminals of a third and fourth transistor are coupled to the source terminals of the fourth transistor and the third transistor respectively, and the third and fourth transistor construct a feedback device. This feedback device provides a positive feedback to the differential pair in the differential mode, thereby increasing AC amplitude of the differential amplifier. Further this feedback device substantially brings the drain currents of the first current path and the second current path into coincidence in the Vcom mode.

16 Claims, 15 Drawing Sheets

200

DIFFERENTIAL AMPLIFIER AND COMPARATOR USING THE SAME

BACKGROUND OF THE INVENTION

1. Field of the Invention

The invention relates to a differential amplifier, and more particularly to a differential amplifier and a comparator using the same.

2. Description of the Related Art

When digital data are transmitted to a display device, one method of transition minimization is achieved by implementing an advanced encoding algorithm that converts 8 bits of data into a 10-bit transition minimized, DC balanced character. The signal is optimized to reduce electromagnetic interference (EMI), which allows taster signal transfer rates with increased accuracy. This differential amplifier circuit allows complimentary limited amplitude signals to be transmitted over twisted pair wires instead of more expensive coaxial cable. For example, TMDS link architecture consists of a TMDS transmitter that encodes and serially transmits a data stream over the TMDS link to a TMDS receiver. For example, a single TMDS link has a bandwidth of 165 MHz, which can be applied to a display with 1600×1200(UXGA) specification at 60 Hz. Consequently, differential amplifiers or voltage comparators used in TMDS receivers must have large gain in order to decode and recover the transmitted signal.

FIG. 1 to FIG. 5 show several conventional amplifiers and voltage comparators. Those conventional amplifiers or voltage comparators, however, do not have large amplification ratio in high frequency for AC amplitude in order to decode and recover the transmitted signal for a TMDS-type receivers. Thus, receivers using these conventional amplifiers or voltage comparators of the prior art may output erroneous data to succeeding devices due to the lack of AC amplitude gain to recover and decode the transmitted signal.

SUMMARY OF THE INVENTION

The present invention is directed to an amplifier and a comparator having large power gain in order to recover the decoded transmitted signals with high transmitting speed. Accordingly, the present invention provides a differential amplifier with having large AC amplitude gain at high operating frequency. In the differential amplifier of the present invention, a first transistor and a first load element construct a first current path, and a second transistor and a second load element construct a second current path, wherein gate terminals of the first transistor and the second transistor serve as differential input terminals for receiving differential input signals. A third and fourth transistor are coupled between the source terminal of the first transistor and the first load element and between the drain terminal of the second transistor and the second load element, respectively. Gate terminals of the third and fourth transistor are coupled to the drain terminals of the fourth transistor and the third transistor respectively, and the source terminals of the third and fourth transistor serve as differential output terminals.

Accordingly, the present invention also provides a latch circuit with two input terminals to receive result signals from the differential output terminals of the differential amplifier as above, and a switching circuit is coupled between the latch circuit and the differential output terminals.

DESCRIPTION OF THE DRAWINGS

For a better understanding of the present invention, reference is made to a detailed description to be read in conjunction with the accompanying drawings, in which.

DETAILED DESCRIPTION OF THE INVENTION

Figure 1:
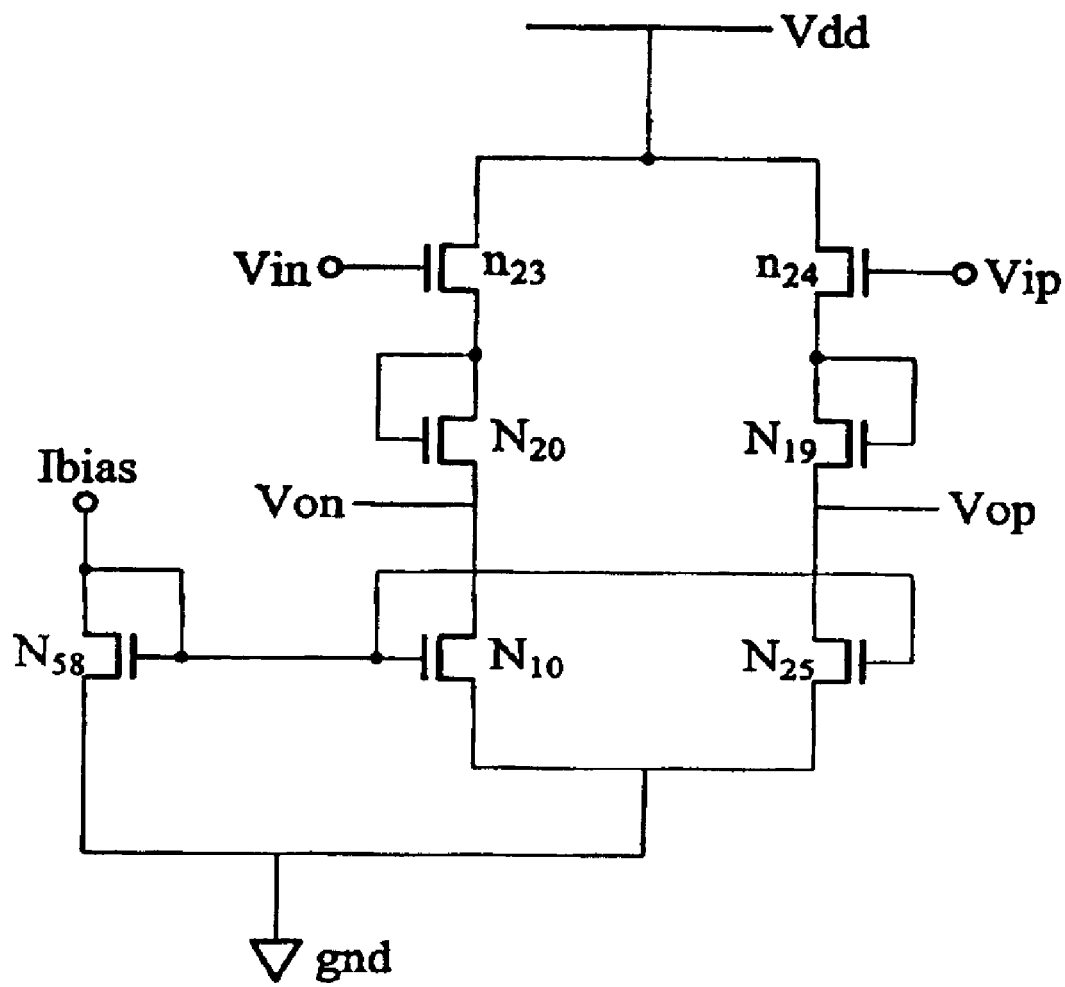
FIG. 1 shows a circuit diagram of a conventional amplifier.
Figure 2:
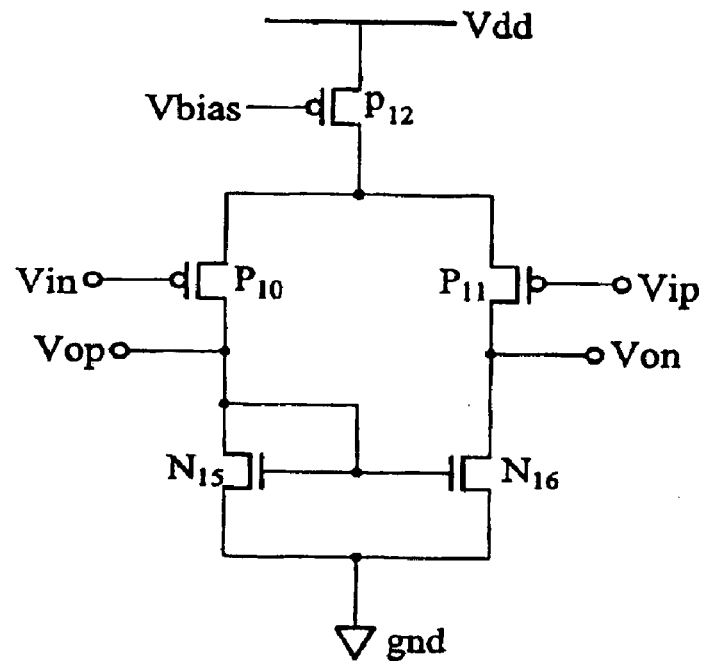
FIG. 2 shows a circuit diagram of an alternate conventional amplifier.
Figure 3:
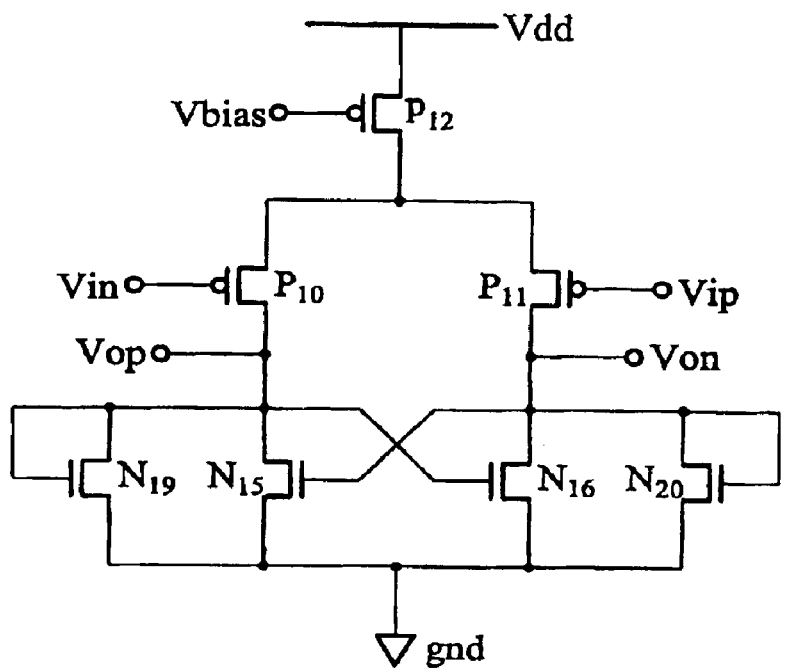
FIG. 3 shows a circuit diagram of an alternate conventional amplifier.
Figure 4:
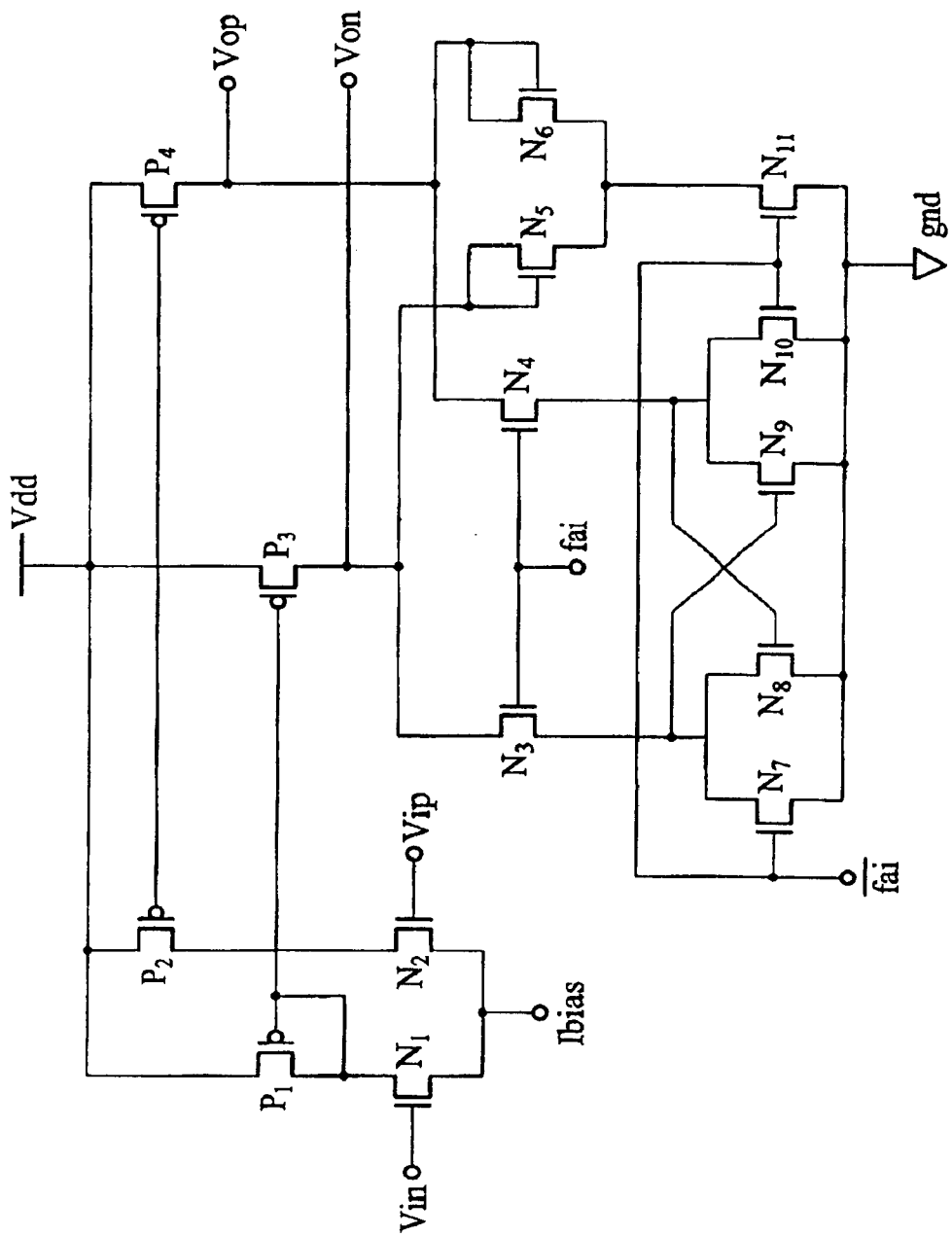
FIG. 4 shows a circuit diagram of a conventional comparator.
Figure 5:
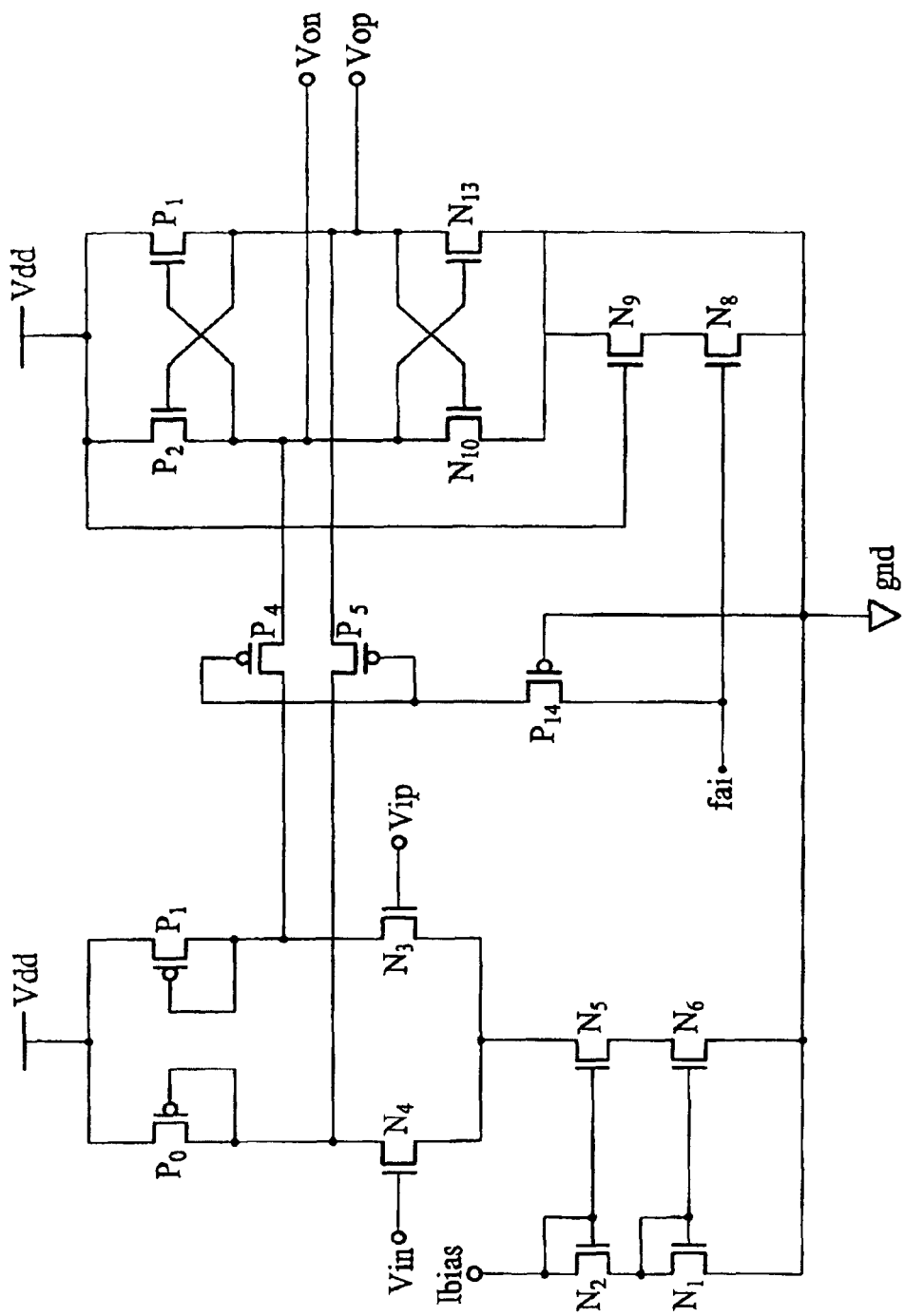
FIG. 5 shows a circuit diagram of an alternate conventional comparator.
Figure 6A:
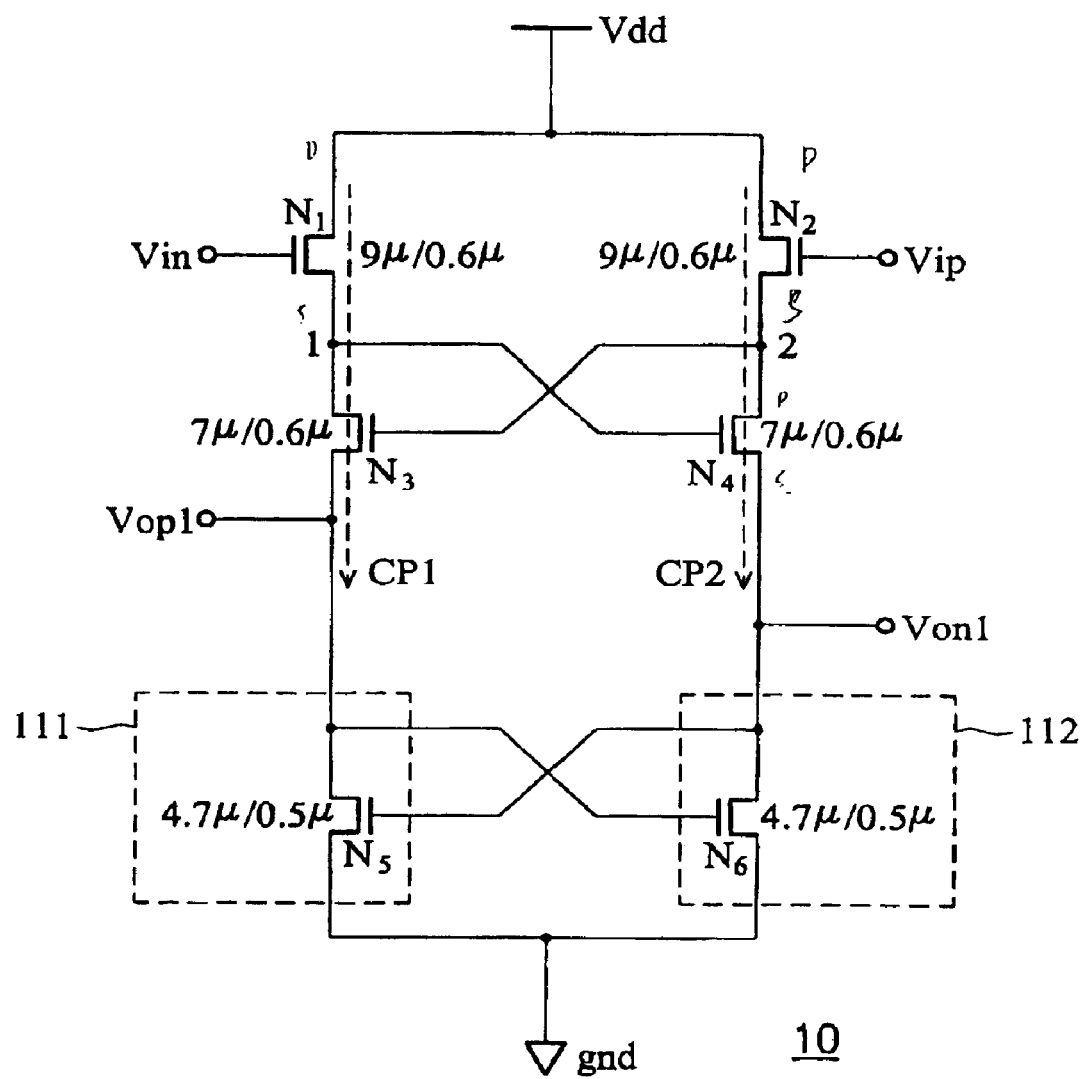
FIG. 6a is a diagram of the differential amplifier of the present invention.

FIG. 6a is a diagram of the differential amplifier according to the present invention. As shown in FIG. 6a, transistors N1 and N3 and a first load element 111 construct a first current path cp1, and transistors N2 and N4 and a second load element 112 construct a second current path cp2, wherein gate terminals of the transistor N1 and the transistor N2 serve as differential input terminals for receiving differential input signals over the link from a transmitter. The gate terminal of the transistor N3 is coupled to the drain terminal of the transistor N4, and the gate terminal of the transistor N4 is coupled to the drain terminal of the transistor N3. The source terminals of the transistor N3 and the transistor N4 serve as differential output terminals. In this case of the present invention, the first load element 111 is a transistor N5 with a gate terminal coupled to the source terminal of the transistor N4, and the second load element 112 is a transistor N6 with a gate terminal coupled to the source terminal of the transistor N3.

When the input signal applied to the gate of the transistor N1 is greater than that applied to the gate of the transistor N2, the current through transistor N1 is greater than the current through the transistor N2, and the output voltage at the output terminal Vop1 is less than the output voltage at the output terminal Von1. When the input signal applied to the gate of the transistor N1 is less than that applied to the gate of the transistor N2, the current through transistor N1 is less than the current through the transistor N2, and the output voltage at the output terminal Vop1 is greater than the output voltage at the output terminal Von1.

In addition, the transistors N3 and N4 are cross coupled, namely, the gate terminals of the transistors N3 and N4 are coupled to the drain terminals of the transistor N4 and N3 respectively. The cross coupled transistors N3 and N4 provide negative feedback to the differential pair constructed by the first transistor N1 and the second transistor N2, in Vcom mode (DC mode). Consequently, the drain currents of the first transistor N1 and the second transistor N2 are brought substantially into coincidence. The Vcom level in the differential output signals is lowered to a predetermined range by this feedback device for compatibility with the successive circuits.

Figure 6B:
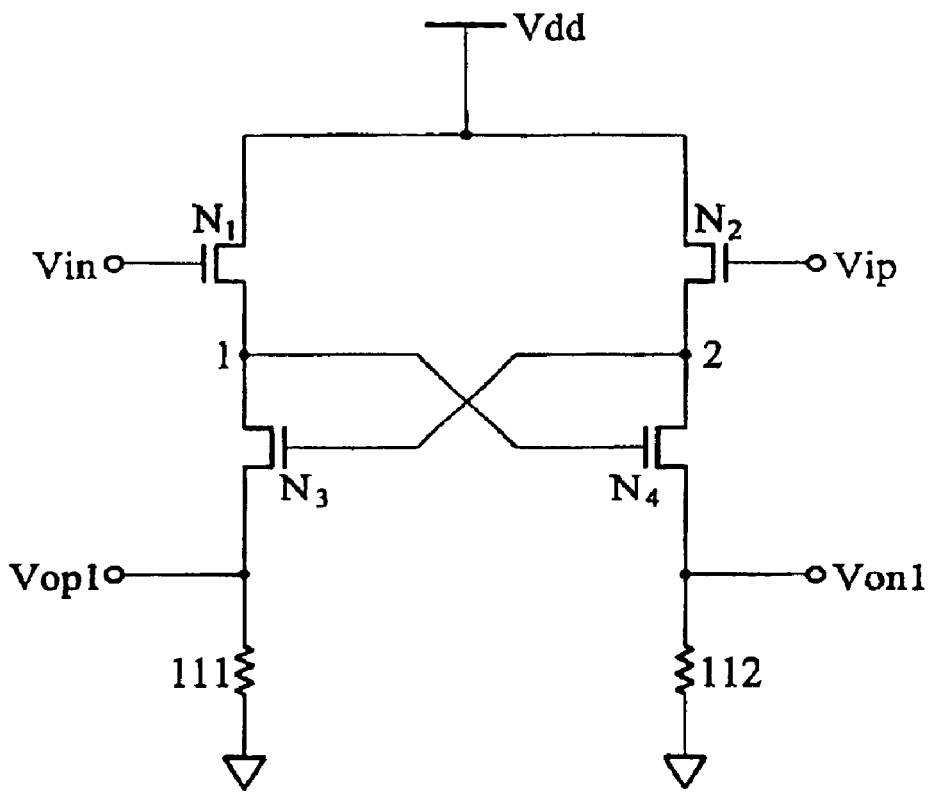
FIG. 6b shows another diagram of the differential amplifier of the present invention.

As shown in FIG. 6b, when the current flowing though the load element 112 is increased, the voltage at terminal Von1 is increased. At this time, however, the voltage difference between the gate and source of the transistor N4 is decreased, and the current flowing through the transistor N4 is decreased such that the current flowing through the loading element 112 is then decreased and the voltage at terminal Von1 is decreased. Therefore, cross-coupled transistors N3 and N4 provide negative feedback to the differential pair constructed by the transistors N1 and N2 in the DC condition.

Figure 6C:
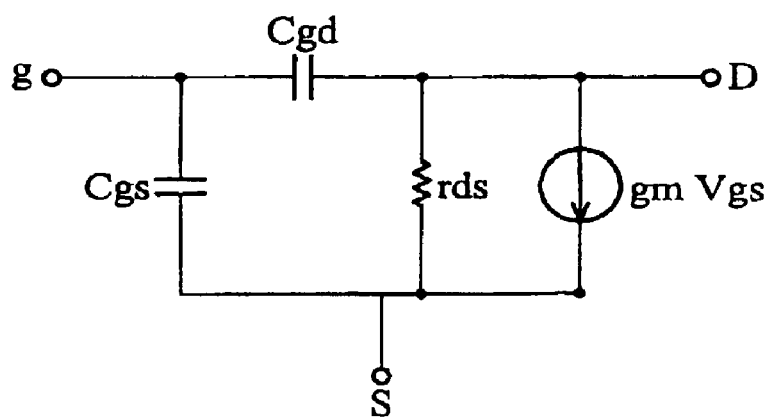
FIG. 6c shows a small model of MOS transistor.

FIG. 6c shows a small model of the MOS transistor. When the MOS transistor is operated at a specific frequency scope, the capacitor Cgs is regarded as a short, namely the gate and the source of the MOS transistor are coupled together. In view of this, at a specific frequency scope, the terminal Von1 and the gate of the transistor N4 are short and the terminal Vop1 and the gate of the transistor N3 are short. In this case, the voltage at node 2 is increased because the gate and the source of the transistor N4 are regarded as short when the voltage at terminal Von1 is increased and the current flowing through the load element is increased. As the voltage at node 2 is increased, the voltage at the terminal Vop1 is increased because the gate and the source of the transistor N3 are regarded as short. By the same way, the voltage at terminal Von1 is then increased and the current flowing through the load element is increased because the gate and the source of the transistor N3 are regarded as short. Therefore, the cross coupled transistor N3 and N4 provide positive feedback for the the differential pair constructed by the transistors N1 and N2 at a specific frequency scope, for example AC condition.

Cross-coupled transistors N3 and N4 serve as a feedback device for a differential pair composed of the transistors N1 and N2. Therefore, gain of the amplifier 10 is infinitely great since a positive feedback is applied by the transistors N3 and N4, and a sufficiently large logic amplitude, i.e., sufficiently large output voltage, is obtained even when the difference between the input voltage becomes smaller than 1 mV. Moreover, since the transistors are arrayed completely symmetrically from the input side to the output side, the cause of developing an offset voltage can be eliminated, that is a defect in the conventional circuits. The power supply noise is equally added to the two input voltages to cancel each other. Therefore, there is no probability that the circuit will be erroneously operated by noise.

Figure 7A:
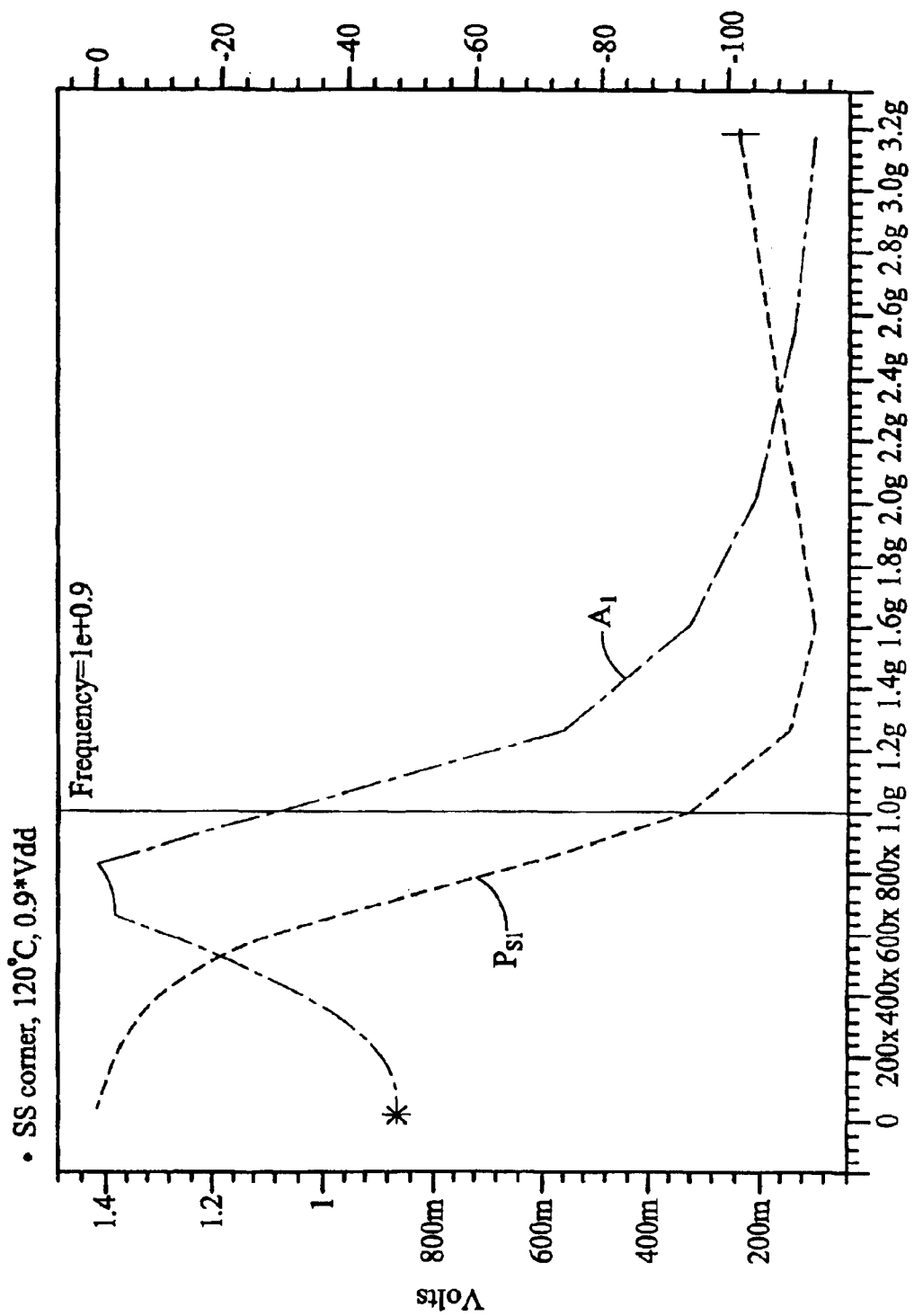
FIGS. 7a to 7c show the frequency characteristics of the differential amplifier according to the present invention under SS corner, TT corner and FF corner, respect vely.
Figure 7B:
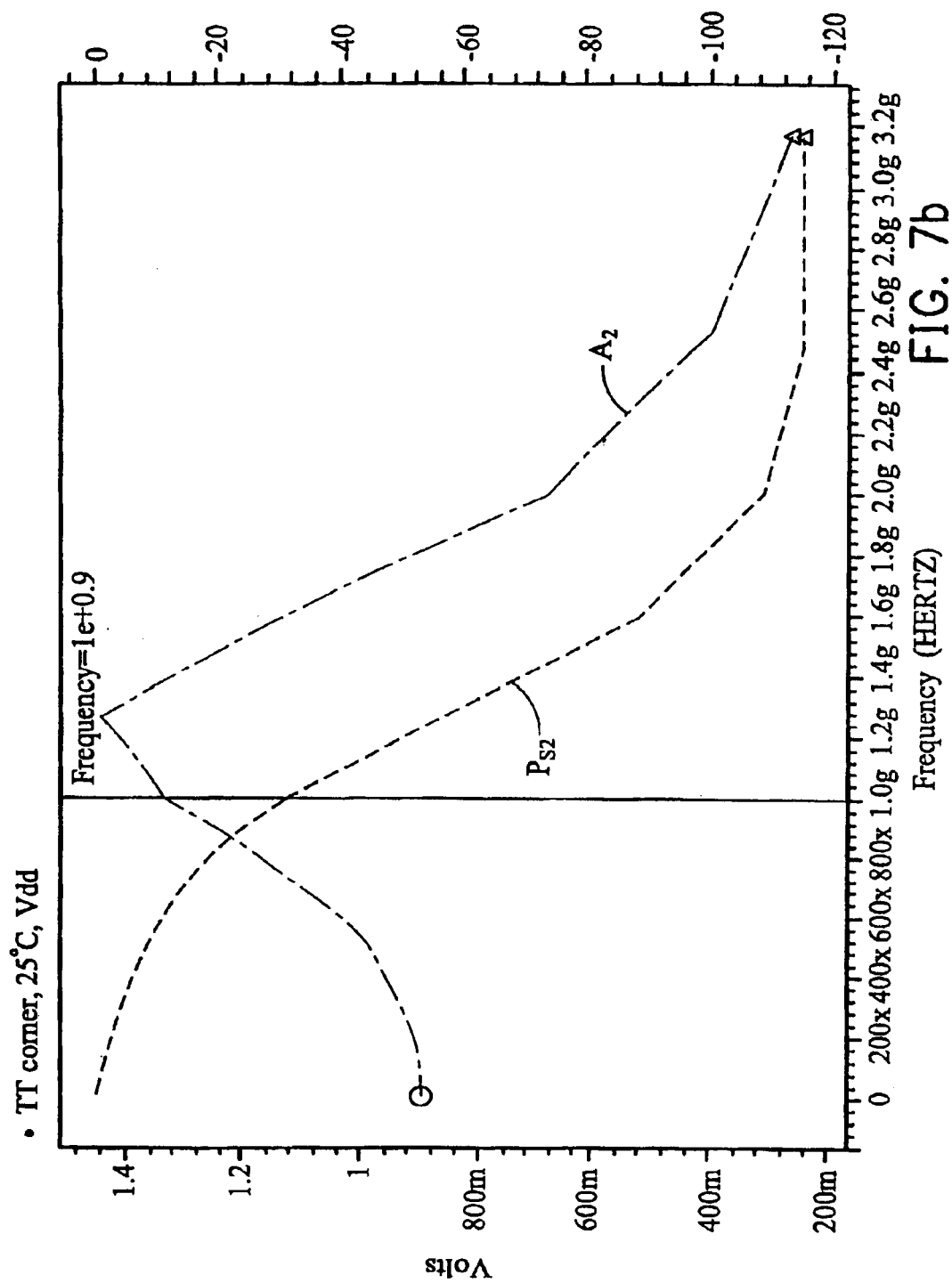
Figure 7C:
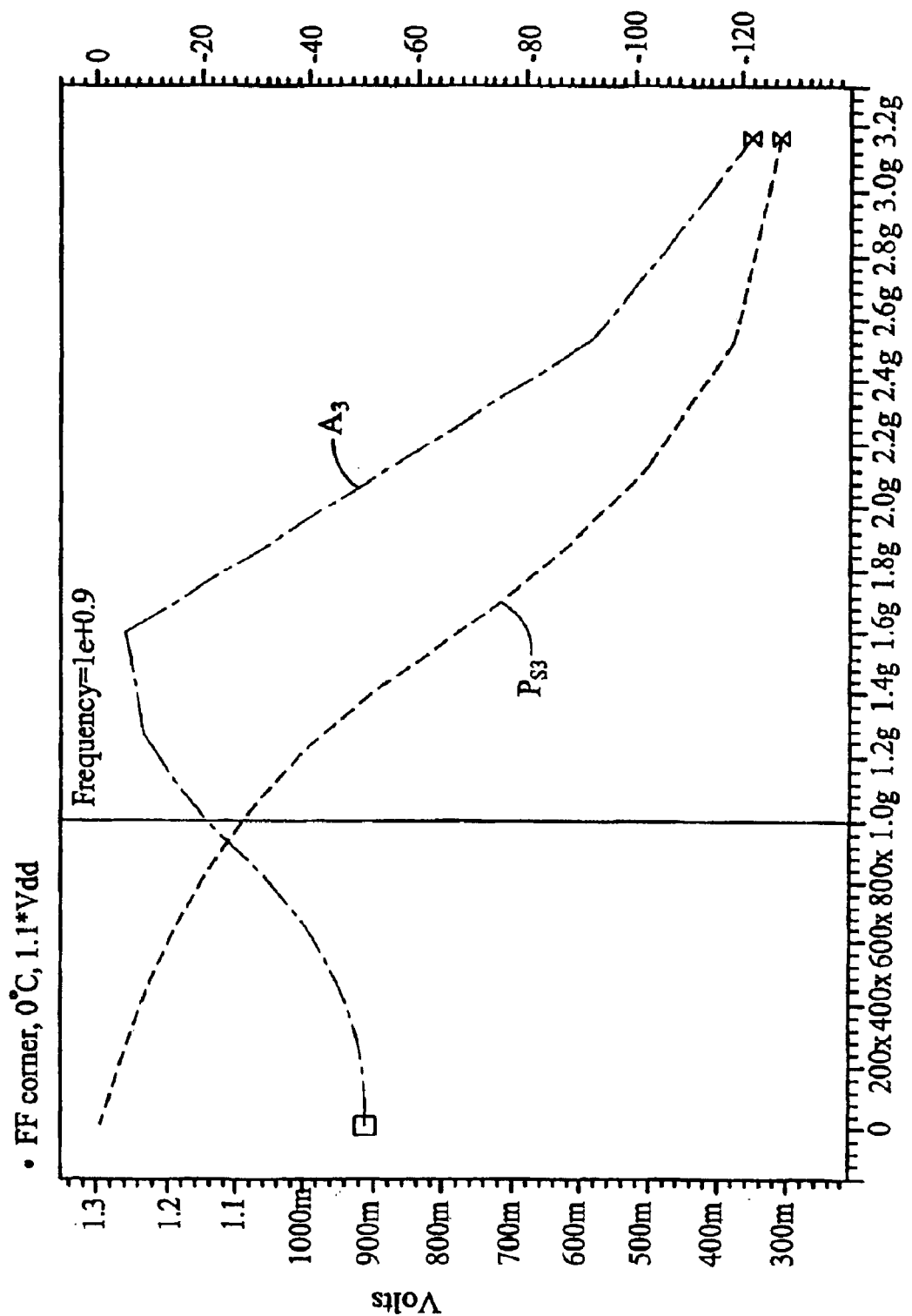

FIGS. 7a to 7c show the frequency characteristic of the differential amplifier 10 according to the present invention, under SS corner process, TT corner process and FF corner process, respectively, the bias current of the current source is 2501 A and the amplitude of the input signal is 1.0V. Moreover, under the TT corner process, the PMOS and NMOS are typical type MOS with a typical speed. Under the SS corner process, the PMOS and NMOS are slow PMOS and slow NMOS with speed slower than of the typical MOS under the TT corner. Under the FF corner process, the PMOS and NMOS are fast PMOS and fast NMOS with speed faster than of the typical MOS under the TT corner.

As shown in FIG. 7a, the differential amplifier is operated at 120° C. and 0.9 times Vdd under SS corner process, and the curve A1 shows the relation between the input signal frequency and alternating current amplificatory multiple of the differential amplifier 10. As shown in FIG. 7a, the AC amplitude of the amplifier is about 1.4V when the input signal frequency is 850 MHz, and the AC amplitude is still over 1V even when the input signal frequency is increased to 1 GHz.

Also, as shown in FIG. 7b, the differential amplifier is operated at 25° C. and Vdd under TT corner process, and the curve A2 shows the relation between the input signal frequency and the AC amplitude of the differential amplifier 10. As shown in FIG. 7b, the AC amplitude of the amplifier is about 1.25V when the input signal frequency is 850 MHz under TT corner process, and further the AC amplitude exceeds 1.3V when the input signal frequency is increased to 1 GHz.

Moreover, as shown in FIG. 7c, the differential amplifier is operated at 0° C. and 1.1 times Vdd under FF corner process, and the curve A3 shows the relation between the input signal frequency and the AC amplitude of the differential amplifier 10. As shown in FIG. 7c, the AC amplitude of the amplifier is about 1.05V when the input signal frequency is 850 MHz under the FF corner process, and further the AC amplitude exceeds 1.1V when the input signal frequency is increased to 1 GHz. As well, the curves Ps1, Ps2 and Ps3 show the relation between the frequency and the phase margin of the amplifier according to the present invention under SS corner process, TT corner process and FF corner process, respectively. Typically, the amplifiers circuit can function normally when the phase margin thereof is less than 1450. As the three curves show in FIGS. 7a to 7c, all phase margins of differential amplifier according to the present invention are less than 130° even when the frequency is increased to 3.2 GHz. Therefore, the differential amplifier of the present invention works normally under the three corner processes.

Consequently, the differential amplifier 10 of the present invention has AC amplitude from 0.9V to 1.4V when the input signal frequency is 850 MHz under the three corner processes, such that the amplifier of the present invention has the ability to recover and decode the high speed transmitted signal.

Figure 8:
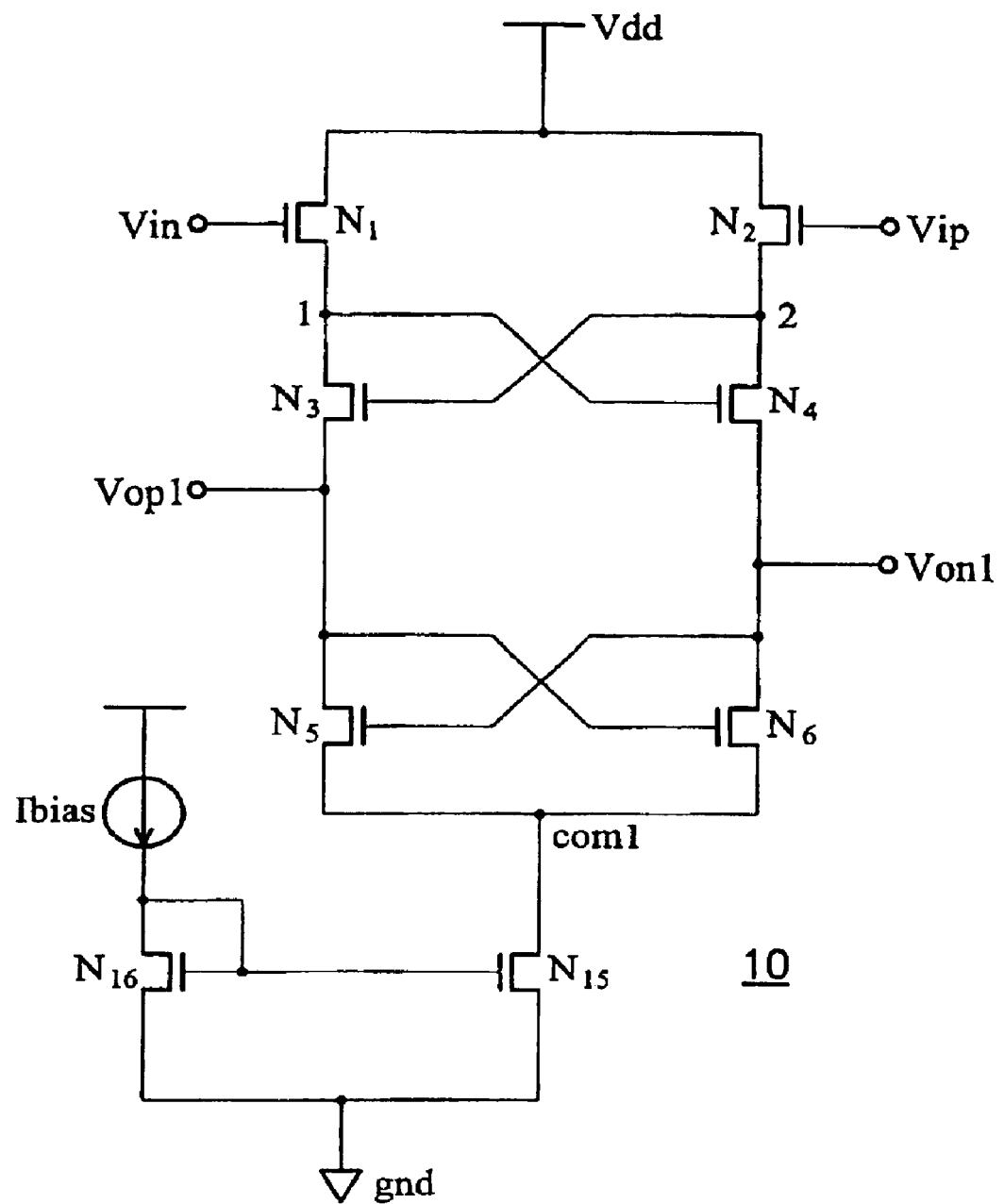
FIG. 8 shows an alternate differential amplifier according to the present invention.

As shown in FIG. 8, the differential amplifier 10 of the present invention further has a current source to connect one end of the first current path cp1 and the second current path cp2 to set the maximum current levels flowing through the current paths cp1 and cp2, thereby decreasing power consumption of the differential amplifier 10. For example, the current source can be coupled to the drain terminals of the transistors N1 and N2 or to the source terminals of the transistors N5 and N6. In this embodiment, the current source composed of a nineteenth transistor N15 and a twentieth transistor N16 is coupled to the source terminals of the transistors N5 and N6, and is driven by a bias current Ibias.

In this case shown in FIG. 6a, if the Vcom level in the input signals is close to Vdd, the current source is preferably connected to the source terminals of the transistors N5 and N6 to allow the amplifier 10 to function normally. If the Vcom level in the input signals is not closed to Vdd, the current source can also be coupled to the drain terminals of the transistors N1 and N2.

Figure 9:
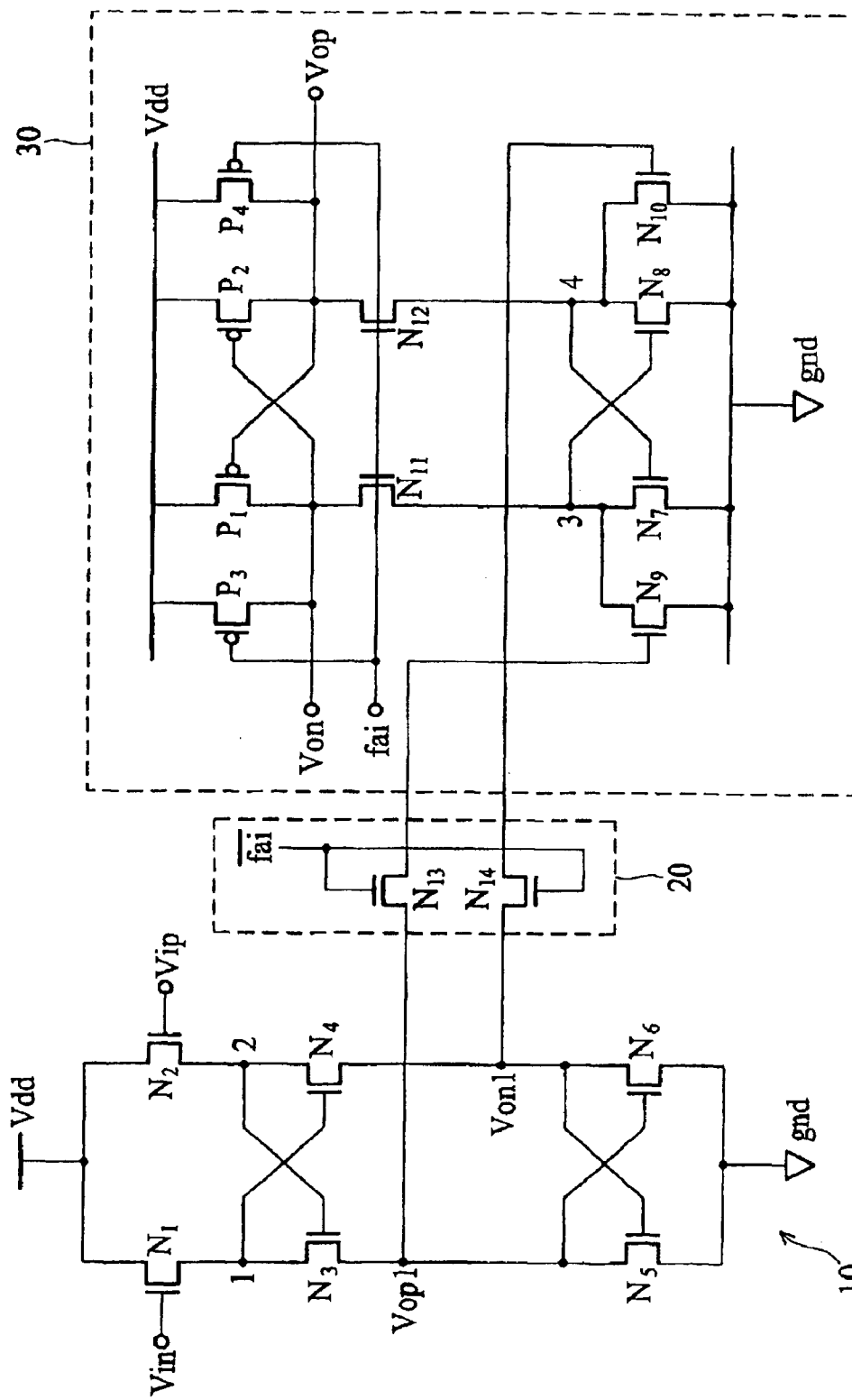
FIG. 9 is a circuit diagram of the comparator according to the present invention.

FIG. 9 shows a comparator 200 for a TMDS receiver of the present invention. A differential amplifier 10 of the comparator 200 has differential input terminals Vin and Vip for receiving TDMS differential input signals, and differential output terminals Vop1 and Von1 for outputting result signals. A switching circuit 20 is coupled to source terminals of the transistors N3 and N4. As well, a latch circuit 30 has two input terminals coupled to the source terminals of the transistors N3 and N4 through the switching circuit 20. Namely, the latch circuit 30 is electrically coupled to the differential output terminals to receive the differential output signals through the switching circuit 20. The switching circuit 20 is composed of transistors N13 and N14, wherein, the first terminals of the transistors N13 and the transistor N14 are coupled to one of the differential output terminal, respectively, and the gate terminals of the transistor N13 and the transistor N14 are coupled to a control signal /fai. The latch circuit 30 is composed of transistors N7, N8, N9, N10, N11, N12, P1, P2, P3 and P4. The latch circuit 30 latches and amplifies the differential output signals from the differential output terminals through the switching circuit 30 and then outputs result signals according to the control signals fai and /fai.

When the input signal applied to the gate of the transistor N1 is greater than that applied to the gate of the transistor N2, the current through transistor N1 is greater than the current through the transistor N2, and the output voltage at the output terminal Vop1 is less than the output voltage at the output terminal Von1. When the input signal applied to the gate of the transistor N1 is less than that applied to the gate of the transistor N2, the current through transistor N1 is less than the current through the transistor N2, and the output voltage at the output terminal Vop1 is greater than the output voltage at the output terminal Von1.

The output terminal Vop1 is coupled via the conduction path of the transistor N13 to the gate terminal of the transistor N9 which functions as one of the two signal inputs to the selectively enabled latch circuit 30. The output terminal Von1 is coupled via the conduction path of the transistor N14 to the gate terminal of the transistor N10 which forms the other of the two signal inputs of the latch circuit 30.

The control signal fai is applied to the gates of the transistors N11, N12, P3 and P4. The control signal /fai is applied to the gates of the transistors N13 and N14, wherein the control signals fai and /fai are opposed to each other. When the control signals fai and /fai are "low" and "high" respectively, the transistors P3, P4, N13 and N14 are turned on and the transistors N11 and N12 are turned off. This applies Vdd volts to output terminals Vop and Von of the latch circuit 30. When the control signals fai and /fai are "high" and "low" respectively, the transistors P3, P4, N13 and N14 are turned off and the transistors N11 and N12 are turned on. Transistor N11 provides a path between node 3 and the output terminal Von, and transistor N12 provides another path between node 4 and the output terminal Vop.

The operation of the latch circuit 30 is illustrated in detail as follows.

First, input signals having voltage levels higher than the threshold voltage of transistors N9 and N10 with a small difference from each other are applied to the gate of the transistors N9 and N10. Therefore, the transistors N9 and N10 are conductive, and the potential at nodes 3 and 4 is low. In addition, the control signals fai and /fai are "low" and "high", respectively, during this period. Therefore, transistors N11 and N12 are nonconductive, and transistors P3 and P4 are conductive, and accordingly the potential at the terminals Von and Vop is equal to the voltage Vdd.

During the next period, the control signals fai and /fai are "low" and "high", respectively, the transistors N11 and N12 are rendered conductive while transistors P3 and P4 are rendered nonconductive. Accordingly, an electric current flows into the first flip-flop consisting of transistors N7 and N8 via transistors N11 and N12. In this instance, if the potential of the input signal at gate of the transistor N9 is higher than the potential of the other input signal at the gate of the transistor N10, more electric current flows into transistor N9 than into the transistor N10. No current flows into the transistors N7 and NB unless the potential at nodes 3 or 4 exceeds the threshold voltage thereof. At an early time after the transistors N11 and N12 are rendered conductive, the nodes 3 and 4 are charged similarly. However, since an amount of discharge from the node 3 via transistor N9 is larger than that from the node 4 via transistor N10, the potential at node 4 exceeds the threshold voltage, first. The transistor N7, then, starts to discharge the charges at the node 3, and the potential at node 3 does not rise. Accordingly, the potential at node 4 continues to rise. Hence, more current flows through transistor N11 than through the transistor N12. Accordingly, the potential at terminal Von becomes lower than the potential at terminal Vop. Therefore, the second flip-flop consisting of transistors P1 and P2 operates, and the potential at terminal Von rapidly falls. Thus, the transistors N9 and N10 will act as data means to determine the potential at the nodes 3 and 4 in accordance with the input signals at the gates thereof, and the output voltage levels at output terminals Von and Vop are consequently determined depending upon the input signals at the gates of the transistors N9 and N10.

To return the latch circuit to its initial condition, the control signal fai and /fai are returned to "low" and "high" respectively. The transistors N11 and N12 are then rendered nonconductive, and the transistors P3, P4, N13 and N14 are rendered conductive. The electric charges at the nodes 3 and 4 are then quickly discharged through the transistor N9 and N10, while the nodes Von and Vop are quickly charged through the transistors P3 and P4 to resume the power supply voltage Vdd.

Figure 10A:
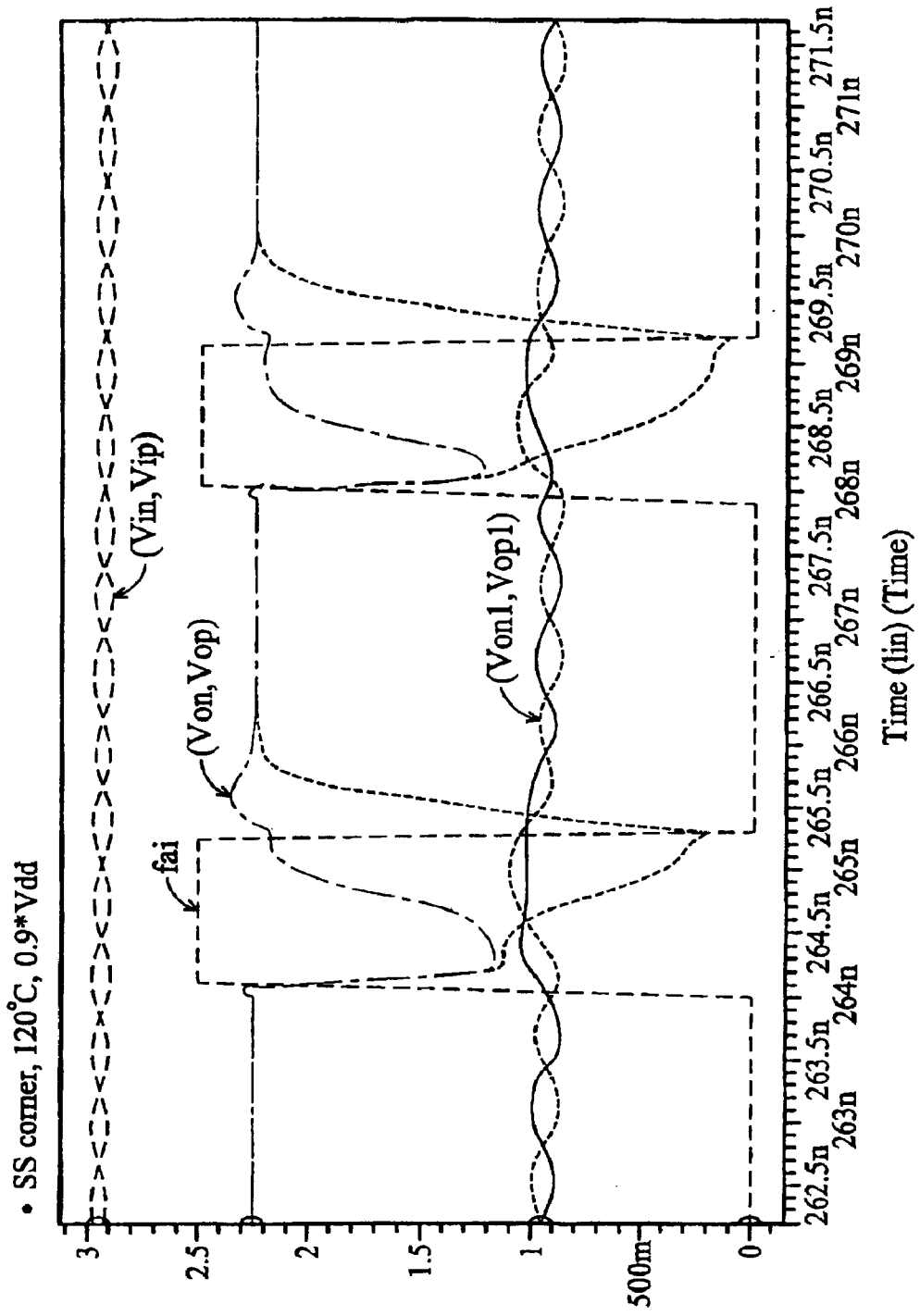
FIGS. 10a to 10c show the waveform of the comparator according to the present invention under SS corner, TT corner and FF corner, respectively.
Figure 10B:
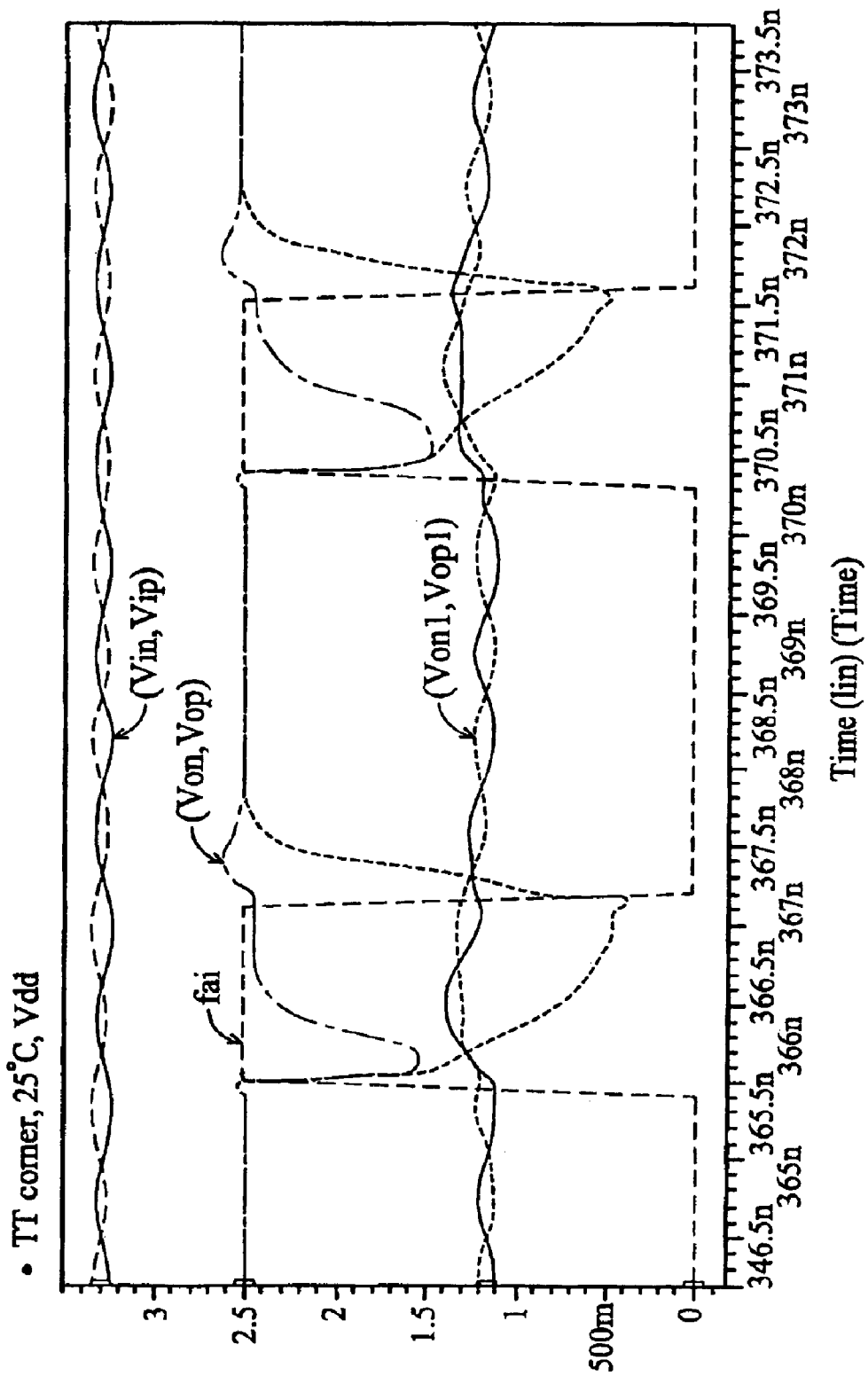
Figure 10C:
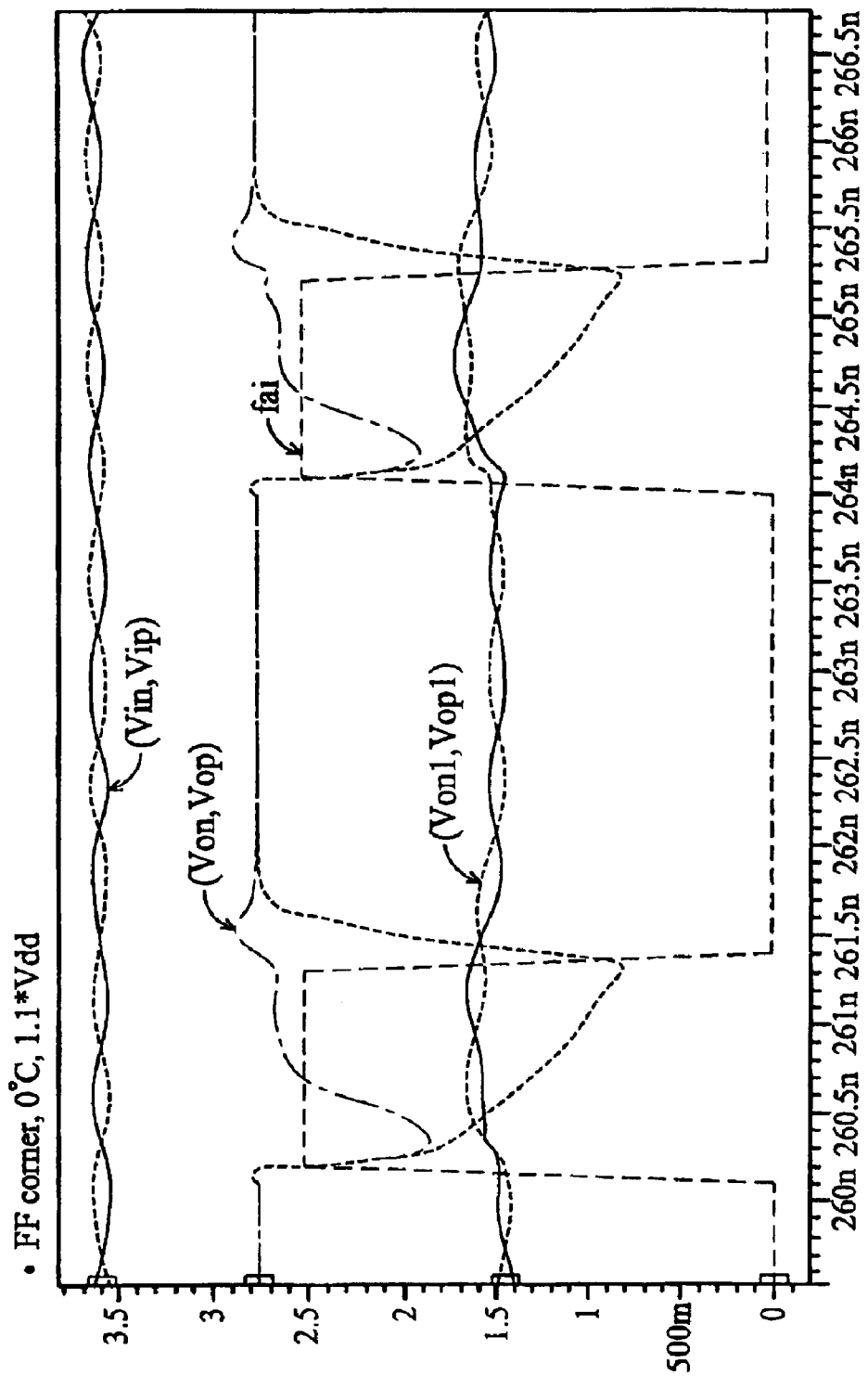

FIGS. 10a to 10c show the simulated waveform of the comparator 200 as shown in FIG. 9 according to the present invention, under SS corner process, TT corner process and FF corner process, respectively, wherein the input signal frequency is 850 MHz and the bias current of the current source is 2501 A.

As shown in FIG. 10a, the control signal fai goes from low to high in store mode, such that the transistor N11 and the transistor N12 are turned on, and transistors P3, P4, N13 and N14 are turned off. Consequently, the differential output signals Von1 and Vop1 produced at the edge where the control signal fai begins going high is latched and amplified by the latch circuit 30, and the result signals Von and Vop are then output.

Furthermore, the control signal fai goes from high to low in clear mode, such that the transistors P3 and P4 are turned on. Consequently, the result signals Von and Vop are adjusted to the same level by the latch circuit. Moreover, the levels of the differential output signals Vop1 and Von1 both descend about 2V from the level of the differential input signals Vin and Vip.

Figure 11:
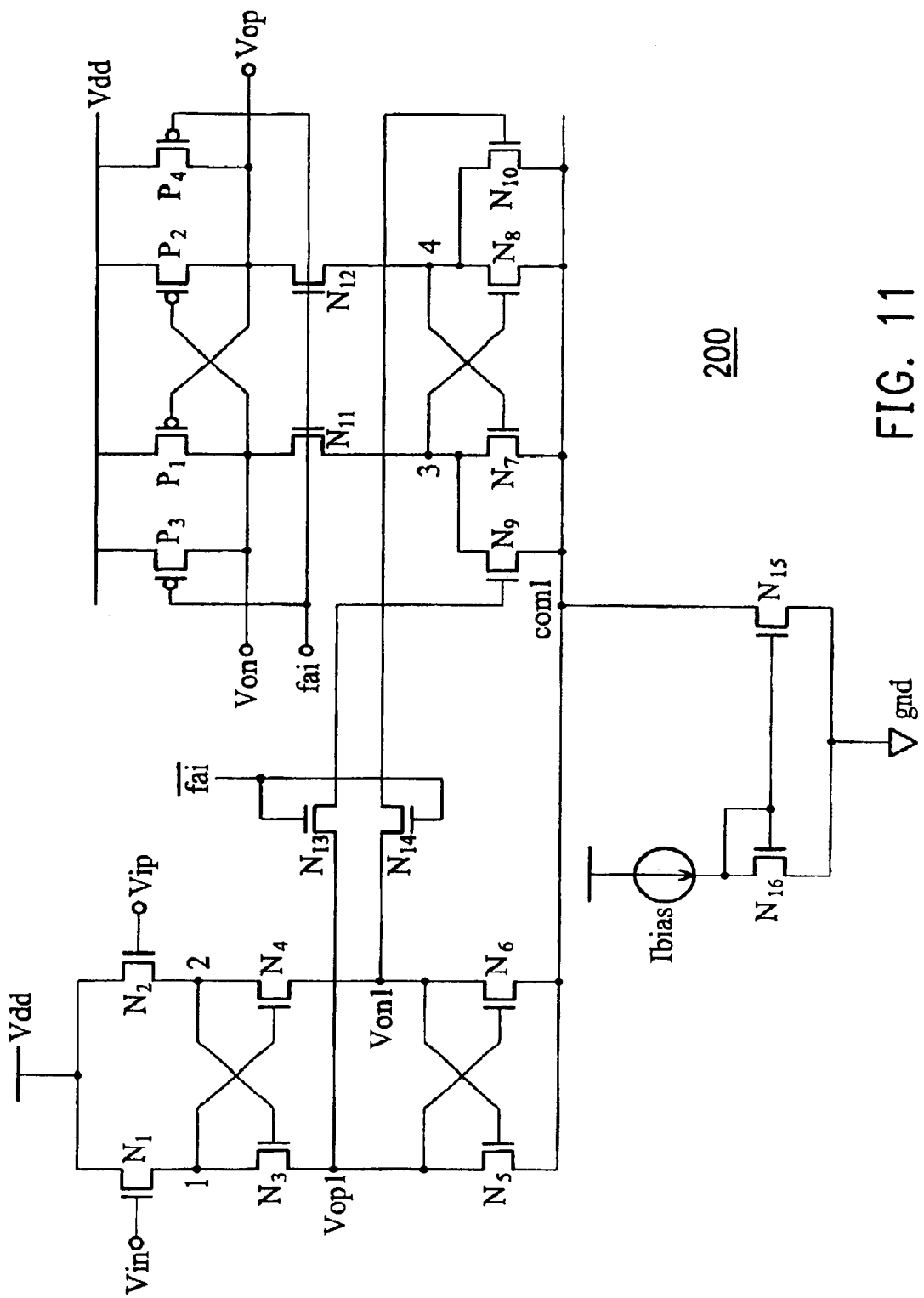
FIG. 11 shows an alternate comparator according to the present invention.

As shown in FIG. 11, the comparator 200 of the present invention further has a current source composed of transistors N15 and N16. This current source keeps the total current through the current paths cp1 and cp2, and the latch circuit 30 constant, thereby decreasing power consumption of the comparator 200.

Thus, the differential amplifier and comparator of the present invention have large AC amplification ration to decode and recover high speed transmitted signals.

The differential amplifier 10 and comparator 20 of the present invention as shown in FIG. 11 are also suitable for use with TMDS receivers, the suitability thereof not meant to limit the scope of the invention in any way.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A differential amplifier for a TMDS receiver, comprising:

a first transistor and a first load element, constructed of a first current path;

a second transistor and a second load element, constructed of a second current path, wherein gate terminals of the first transistor and the second transistor serve as differential input terminals;

a third and fourth transistor cross-coupled between the source terminal of the first transistor and the first load element and between the source terminal of the second transistor and the second load element respectively, wherein gate terminals of the third transistor and the fourth transistor are coupled to the drain terminals of the fourth transistor and the third transistor respectively, and the source terminals of the third and fourth transistors serve as differential output terminals; and a current source coupled to a common terminal of the first load and the second load.

2. The differential amplifier of claim 1, wherein the first load element is a fifth transistor whose gate terminal is coupled to the source terminal of the fourth transistor, and wherein the second load element is a sixth transistor whose gate terminal is coupled to the source terminal of the third transistor.

3. The differential amplifier of claim 2, wherein the first, second, third, fourth, fifth and sixth transistors are N-type transistors.

4. A voltage comparator, comprising:

a differential amplifier comprising:

a first transistor and a first load element, constructed of a first current path;

a second transistor and a second load element constructed of a second current path, wherein gate terminals of the first transistor and the second transistor serve as differential input terminals; and a third transistor and a fourth transistor cross-coupled between the source terminal of the first transistor and the first load element and between the source terminal of the second transistor and the second load element respectively, wherein gate terminals of the third transistor and fourth transistor are coupled to the drain terminals of the fourth transistor and the third transistor respectively, and wherein the source terminals of the third and fourth transistors serve as differential output terminals;

a latch circuit having two input terminals electrically coupled to the differential output terminals; and a switching circuit coupled between the latch circuit and the differential output terminals.

5. The comparator of claim 4, further comprising a current source coupled to the latch circuit and first ends of the first current path and the second current path.

6. The comparator of claim 4, wherein the first load element is a fifth transistor whose gate terminal is coupled to the source terminal of the fourth transistor, and the second load element is a sixth transistor whose gate terminal is coupled to the source terminal of the third transistor.

7. The comparator of claim 4, wherein the latch circuit comprises:

a seventh transistor having a drain terminal and a gate terminal;

an eighth transistor having a drain terminal and a gate terminal, wherein the gate terminals of the seventh transistor and the eighth transistor are coupled to the drain terminals of the eighth transistor and the seventh transistor, respectively;

a ninth transistor coupled in parallel with the seventh transistor;

a tenth transistor coupled in parallel with the eighth transistor;

an eleventh transistor having a drain terminal and a gate terminal;

a twelfth transistor having a drain terminal and a gate terminal, wherein the gate terminals of the eleventh transistor and the twelfth transistor are coupled to the drain terminals of the twelfth transistor and the eleventh transistor, respectively;

a thirteenth transistor coupled in parallel with the eleventh transistor;

a fourteenth transistor coupled in parallel with the twelfth transistor;

a fifteenth transistor having a drain terminal coupled to the drain terminal of the eleventh transistor and a source terminal coupled to the drain terminal of the seventh transistor; and a sixteenth transistor having a drain terminal coupled to the drain terminal of the twelfth transistor and a source terminal coupled to the drain terminal of the eighth transistor, wherein the gate terminals of the ninth transistor and the tenth transistor are electrically coupled to the differential output terminals through the switching circuit, and a control terminal is coupled to the gate terminals of the thirteenth transistor, the fourteenth transistor, the fifteenth transistor and the sixteenth transistor.

8. The comparator of claim 7, further comprising a current source coupled to the source terminals of the seventh, eighth, ninth and tenth transistors.

9. A combination, comprising:

a differential amplifier stage having first and second inputs for the applications thereto of the first and second input signals respectively and having first and second differential outputs at which are produced first and second output signals corresponding to the relative value of the first and second input signals, wherein the differential amplifier stage has an AC gain;

a feedback device coupled between the inputs and the differential outputs of the differential amplifier stage to provide negative feedback for the differential amplifier stage in DC condition, and to provide positive feedback for the differential amplifier stage in a specific frequency scope, thereby increasing AC gain of the differential amplifier stage;

a first load element coupled between the first differential output and a first power terminal; and a second load element coupled between the second differential output and the first power terminal, wherein the first load element includes a fifth transistor having a gate coupled to the second differential output, and a drain and a source coupled to the first differential output and the first power terminal respectively, and the second load element includes a sixth transistor having a gate coupled to the first differential output, and a drain and a source coupled to the second differential output and the first power terminal respectively.

10. The combination of claim 9, wherein the differential amplifier stage includes first and second differential connected transistors having drains coupled to the first and second differential outputs respectively.

11. The combination of claim 10, wherein the feedback device includes a third transistor and a fourth transistor cross-coupled together, the gate of the third transistor coupled to the drain of the fourth transistor, the drain and source of the third transistor coupled to the source of the first transistor and the first differential output respectively, the gate of the fourth transistor coupled to the drain of the third transistor, and the drain and source of the fourth transistor coupled to the source of the first transistor and the second differential output respectively.

12. The combination of claim 9, further comprising a current source coupled between the sources of the fifth and sixth transistors and the first power terminal.

13. The combination of claim 11, wherein the first, second, third, and fourth transistors are N-type transistors.

14. The combination of claim 11, further comprising:

a latch circuit having a first and a second inputs;

a first transmission gate coupled between the first output of the differential pair and the first input of the latch circuit; and a second transmission gate coupled between the second output of the differential pair and the second input of the latch circuit, wherein the latch circuit receives the output signals from the differential pair when the first and second transmission gates are turned on, and the latch circuit outputs output signals corresponding to the relative values of the received signal from the differential pair when the first and second transmission gates are turned off.

15. The combination of claim 14, the latch circuit having:

seventh and eighth transistors of a first conductive type, the seventh transistors having a source terminal and drain terminal coupled to the first power terminal and a first node respectively and a gate terminal coupled to a second node, the eighth transistors having a source terminal and drain terminal coupled to the first power terminal and the second node respectively and a gate terminal coupled to the first node;

a ninth transistor coupled in parallel with the seventh transistor;

a tenth transistor coupled in parallel with the eighth transistor;

an eleventh transistor and a twelfth transistor of a second conductive type, the eleventh transistors having a source terminal and drain terminal coupled to the second power terminal and a third node respectively and a gate terminal coupled to a fourth node, the twelfth transistors having a source terminal and drain terminal coupled to the second power terminal and the fourth node respectively and a gate terminal coupled to the third node;

a thirteenth transistor coupled in parallel with the eleventh transistor;

a fourteenth transistor coupled in parallel with the twelfth transistor;

a fifteenth transistor of the first conductive type coupled between the first node and the third node; and a sixteenth transistor of the first conductive type coupled between the second node and the fourth node, wherein the gate terminals of the ninth and tenth transistor are electrically coupled to the first and second transmission gates, and the gate terminals of the thirteenth, fourteenth, fifteenth and sixteenth transistors are coupled to a control signal terminal.

16. The combination of claim 15, wherein the seventh, eighth, ninth, tenth, fifteenth, and sixteenth transistors are N-type transistors, and the eleventh, twelfth, thirteenth and fourteenth transistors are P-type transistor.

* * * * *